(12) United States Patent
Jin

(10) Patent No.: US 6,841,442 B1
(45) Date of Patent: Jan. 11, 2005

(54) METHOD FOR FORMING METAL CONTACT OF SEMICONDUCTOR DEVICE

(75) Inventor: Sung Gon Jin, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/875,481

(22) Filed: Jun. 24, 2004

(30) Foreign Application Priority Data

Nov. 28, 2003 (KR) .............................. 10-2003-0085800

(51) Int. Cl.⁷ .......................................... H01L 21/8242
(52) U.S. Cl. ...................... 438/239; 438/253; 438/256; 438/396; 438/399; 438/597; 438/618; 438/629; 438/672; 438/675; 438/676; 438/680; 438/685
(58) Field of Search ................................ 438/239, 253, 438/256, 396, 399, 597, 618, 627, 629, 643, 648, 653, 656, 672, 675–676, 680, 685

(56) References Cited

U.S. PATENT DOCUMENTS

| | | | |
|---|---|---|---|
| 6,180,522 B1 * | 1/2001 | Hong | 438/659 |
| 6,688,584 B2 * | 2/2004 | Iyer et al. | 257/750 |
| 2001/0021579 A1 * | 9/2001 | Hu et al. | 438/625 |
| 2002/0090785 A1 * | 7/2002 | Hu et al. | 438/262 |
| 2004/0058519 A1 * | 3/2004 | Wu et al. | 438/597 |

* cited by examiner

Primary Examiner—Lynne A. Gurley
(74) Attorney, Agent, or Firm—Ladas & Parry LLP

(57) ABSTRACT

Disclosed is a method for forming a metal contact of a semiconductor device. The method includes the steps of preparing a substrate formed with a tungsten bit line, forming an insulating interlayer on an entire surface of the substrate, forming a contact hole expositing the tungsten bit line, depositing a first tungsten layer on the insulating interlayer through an IMP process, depositing a second tungsten layer on the first tungsten layer through a CMP process, and performing an etch back process with respect to the second tungsten layer. After depositing the first tungsten layer through the IMP process, the second tungsten layer is deposited trough the CVD process without forming the barrier metal. Thus, contact filling failure is prevented when CVD tungsten is deposited, thereby preventing metal contact failure while improving reliability and a yield rate of the semiconductor devices.

5 Claims, 4 Drawing Sheets

METHOD FOR FORMING METAL CONTACT OF SEMICONDUCTOR DEVICE

BACKGROUND OF THE INVENTION

1. Field of the Invention

The present invention relates to a method for forming a metal line of a semiconductor device, and more particularly to a method for forming a metal line of a semiconductor device, capable of preventing step coverage failure of a barrier metal and contact filling failure of CVD tungsten.

2. Description of the Prior Art

A size of cells has been gradually shrunken due to high-integration of semiconductor devices, so a height of a capacitor is gradually increased in order to allow the capacitor to have sufficient capacitance identical to capacitance of a conventional capacitor. For example, in a semiconductor device having a size less than 0.10 μm, the height of the capacitor must exceed 25000 Å. For this reason, a metal contact used for electrically connecting a lower conductive pattern to a metal line typically has a height above 30000 Å.

However, if the height of the metal contact increases even through a sectional area of a contact is reduced due to shrinkage of a cell size, step coverage failure of a barrier metal and contact filling failure of CVD tungsten may occur, causing metal contact failure and deteriorating reliability and a yield rate of semiconductor devices.

In detail, in order to allow the capacitor to have sufficient capacitance, two-stepped oxide layers is formed as an insulating interlayer when fabricating the capacitor, thereby ensuring a dimension for a lower portion of the capacitor. At this time, a BPSG layer or a PSG layer having a high wet etch rate is used for a lower oxide layer and a TEOS layer or a USG layer is used for an upper oxide layer. Thus, the dimension of the lower portion of the capacitor, which may become reduced during a dry etch process, can be enlarged through a wet etch process, thereby allowing the capacitor to have sufficient capacitance.

However, when the barrier metal is deposited at a temperature above 400° C., MOCVD TiN cannot be sufficiently deposited in a metal contact in the vicinity of the BPSG layer or the PSG layer due to out gassing. Accordingly, when tungsten is deposited through the following CVD process, tungsten may react with Ti deposited in the vicinity of the BPSG layer or the PSG layer, thereby causing a volcano phenomenon. For this reason, contact filling failure of tungsten may occur, thereby causing metal contact failure.

FIGS. 1 and 2 are photographic views showing metal contact failure caused by a volcano phenomenon occurring in a lower portion of a metal contact, in which Ti is reacted with WF6 due to step coverage failure of a barrier metal (TiN) so that the volcano phenomenon is created.

In addition, if a single oxide layer is used as an insulating interlayer, a height of the contact becomes increased even through a sectional area of the contact becomes decreased, so step coverage failure of a barrier metal (TiN) may occur, thereby resulting metal contact failure.

SUMMARY OF THE INVENTION

Accordingly, the present invention has been made to solve the above-mentioned problems occurring in the prior art, and an object of the present invention is to provide a method for forming a metal contact of a semiconductor device, capable of preventing contact filling failure of CVD tungsten and step coverage failure of a barrier metal.

Another object of the present invention is to provide a method for forming a metal contact, capable of improving reliability and a yield rate of semiconductor devices by preventing contact filling failure of CVD tungsten and step coverage failure of a barrier metal.

In order to accomplish the object, there is provided a method for forming a metal contact of a semiconductor device, the method comprising the steps of: preparing a silicon substrate formed with a tungsten bit line; forming an insulating interlayer on an entire surface of the silicon substrate such that the tungsten bit line is covered with the insulating interlayer; forming a contact hole expositing the tungsten bit line by etching the insulating interlayer; depositing a first tungsten layer on the insulating interlayer including a contact hole surface through an ionized metal plasma process; depositing a second tungsten layer on the first tungsten layer through a chemical vapor deposition process such that the contact hole is filled up with the second tungsten layer; and performing an etch back process with respect to the second tungsten layer such that the silicon substrate is exposed.

According to the preferred embodiment of the present invention, the first tungsten layer is deposited with a thickness of about 300 to 500 Å at a temperature of about 0 to 300° C. and the second tungsten layer is deposited with a thickness of about 3000 to 5000 Å.

In addition, a wet cleaning process is carried out for removing a natural oxide layer existing in an exposed surface of the tungsten bit line, after the contact hole is formed and before the first tungsten layer is deposited.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
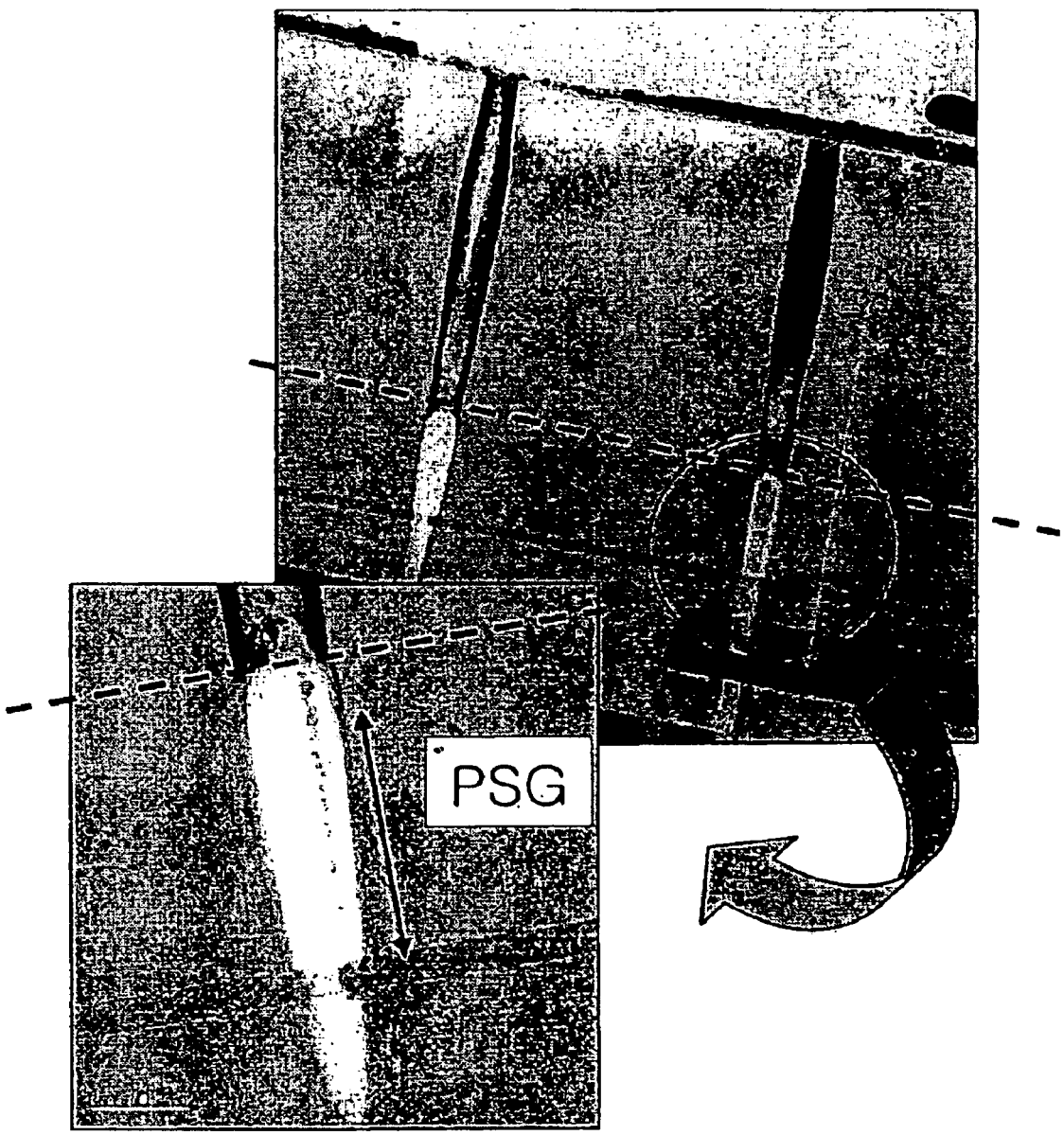
FIGS. 1 and 2 are photographic views showing a volcano phenomenon created in a conventional contact.
Figure 2:
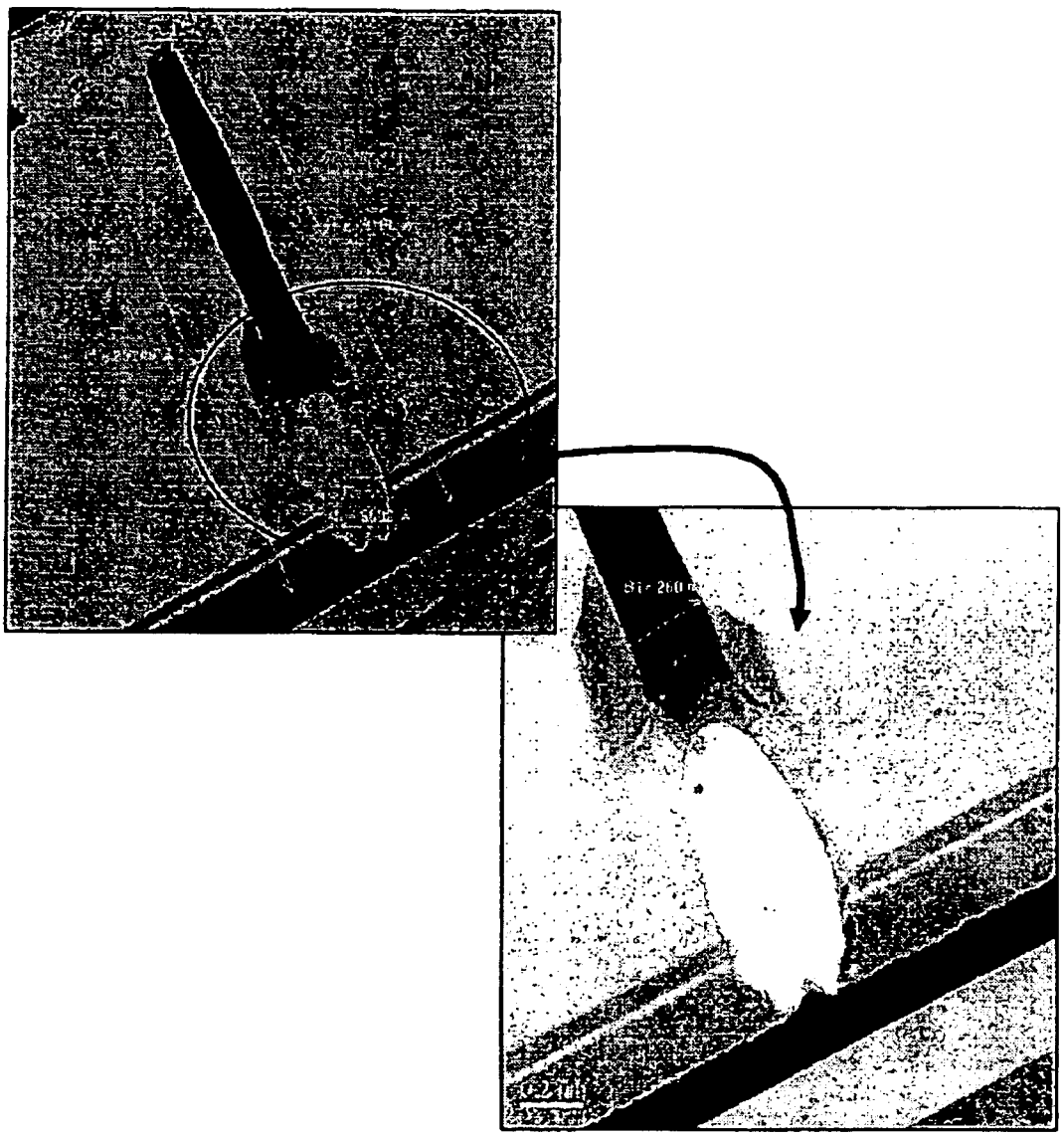

Hereinafter, a preferred embodiment of the present invention will be described with reference to the accompanying drawings. In the following description and drawings, the same reference numerals are used to designate the same or similar components, and so repetition of the description on the same or similar components will be omitted.

Firstly, a technical principle of the present invention will be described below.

A volcano phenomenon is generated when tungsten is deposited due to TiFx, which is created because fluorine (F) of source gas (WF6) is reacted with Ti of a barrier metal (Ti or TiN). Accordingly, if such TiFx is prevented from being created, metal contact failure resulting from contact filling failure of tungsten can be prevented.

In addition, such metal contact failure is also created due to step coverage failure of the barrier metal. Therefore, if such step coverage failure of the barrier metal is removed, that is, if the barrier metal is removed, metal contact failure resulting from step coverage failure of the barrier metal can be prevented.

Meanwhile, since a metal contact is not only formed in a bit line, but also formed in a PMOS silicon substrate and an NMOS silicon substrate, Ti-deposition must be carried out in order to stabilize contact resistance with respect to the silicon substrate caused by $TiSi_2$. Accordingly, TiN is used as a barrier metal of CVD tungsten when forming the metal contact. However, since tungsten is currently used as bit line material, the metal contact is formed only in the bit line without forming the metal contact in the PMOS silicon substrate and the NMOS silicon substrate. Thus, Ti-deposition for stabilizing contact resistance with respect to the silicon substrate is no longer required.

Therefore, according to a method of forming the metal contact of the present invention, tungsten is deposited without forming a barrier metal of TiN, thereby preventing TiFx, which causes the volcano phenomenon, from being created. In addition, since step coverage failure of the barrier metal (TiN) is prevented, metal contact failure resulting from step coverage failure of the barrier metal does not occur.

Figure 3:
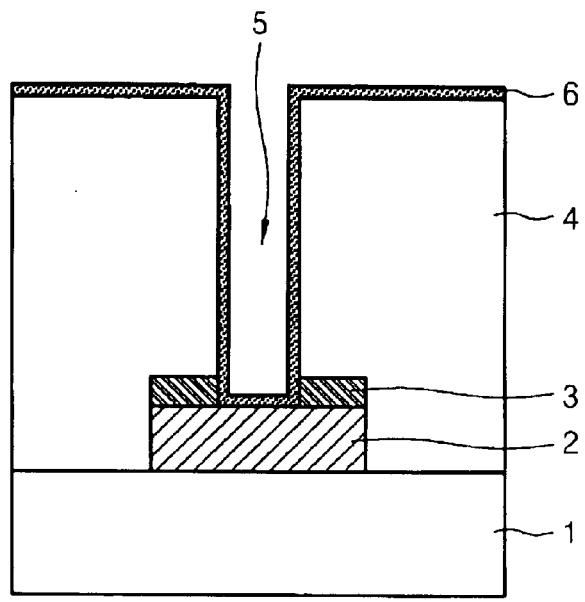
FIGS. 3 to 5 are sectional views for explaining a method for forming a metal contact of a semiconductor device according to one embodiment of the present invention.
Figure 4:
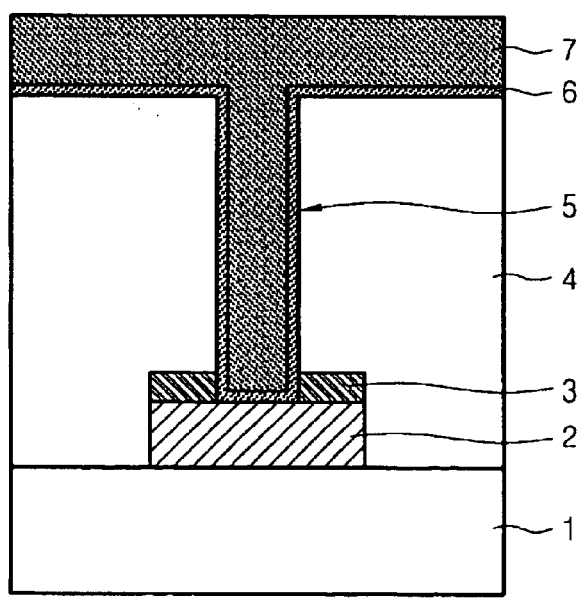
Figure 5:
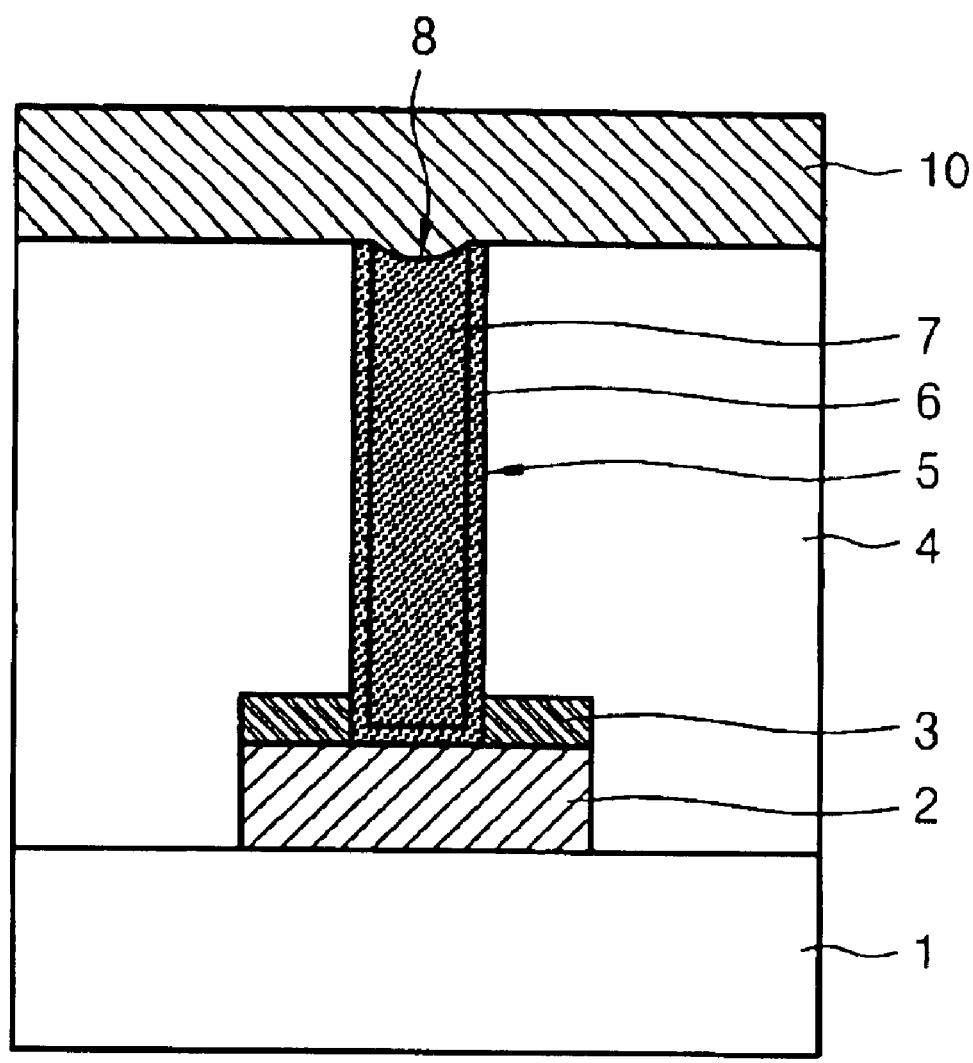

FIGS. 3 to 5 are sectional views for explaining a method for forming a metal contact of a semiconductor device according to one embodiment of the present invention.

Referring to FIG. 3, a silicon substrate 1 having a tungsten bit line 2 formed through a typical semiconductor manufacturing process is prepared. Then, an insulating interlayer 4 is formed on an entire surface of the silicon substrate 1 such that the tungsten bit line 2 is covered with the insulating interlayer 4.

Herein, the tungsten bit line 2 is formed at an upper surface thereof with a nitride hard mask 3, and the insulating interlayer 4 is a stacked layer including at least two oxide layers.

In addition, a contact hole 5 having a high step difference and a small size is formed by etching the insulating interlayer 4 and the nitride hard mask 3 formed on the tungsten bit line 2, thereby exposing the tungsten bit line 2. After that, a natural oxide layer existing on a surface of the tungsten bit line 2 exposed by the contact hole 5 is removed through a wet etch process by using chemicals including BOE or HF, or through an RF etch process. Subsequently, a first tungsten layer 6 used for a barrier metal is deposited with a thickness of about 300 to 500 Å through an IMP (ionized metal plasma) process in such a manner that a CVD tungsten-deposition is stably carried out in order to form a metal contact and to fill the contact hole. At this time, the deposition process for the first tungsten layer is carried out at a temperature of about 0 to 300° C.

Referring to FIG. 4, a second tungsten layer 7 is deposited on the first tungsten layer 6 for the barrier metal at a thickness of about 3000 to 5000 Å through the CVD process such that the contact hole is completely filled up with the second tungsten layer 7. At this time, since the barrier metal of TiN does not exist when depositing the second tungsten layer 7, the volcano phenomenon caused by TiFx is not generated. Therefore, the contact hole is stably filled up with the second tungsten layer 7, thereby preventing metal contact failure.

Referring to FIG. 5, the second tungsten layer 7 is subject to an etch-back process or a CMP process such that the silicon substrate 1 is exposed, thereby forming a metal contact 8 making contact with the tungsten bit line 2. After that, an aluminum metal line 10 making contact with the metal contact 8 is formed on the substrate 1 including the metal contact 8.

As described above, according to the method for forming the metal contact of the present invention, after depositing the first tungsten layer having a thin thickness through the IMP process, the second tungsten layer for filling the contact is deposited trough the CVD process without forming the barrier metal. Accordingly, contact filling failure caused by the volcano phenomenon generated from a lower portion of the contact can be prevented when CVD tungsten is deposited. Thus, metal contact failure resulting from such contact filling failure can be prevented. In addition, according to the present invention, it is not necessary to deposit the barrier metal of TiN, so metal contact failure resulting from step coverage failure of the barrier metal can be prevented.

That is, the present invention can improve reliability and a yield rate of the semiconductor devices by preventing step coverage failure of the barrier metal and contact filling failure caused by the volcano phenomenon.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a metal contact of a semiconductor device, the method comprising the steps of:

i) preparing a silicon substrate formed with a tungsten bit line;

ii) forming an insulating interlayer on an entire surface of the silicon substrate such that the tungsten bit line is covered with the insulating interlayer;

iii) forming a contact hole exposing the tungsten bit line by etching the insulating interlayer;

iv) depositing a first tungsten layer on the insulating interlayer including a contact hole surface through an ionized metal plasma process;

v) depositing a second tungsten layer on the first tungsten layer through a chemical vapor deposition process such that the contact hole is filled up with the second tungsten layer; and vi) performing an etch back process with respect to the second tungsten layer such that the silicon substrate is exposed.

2. The method as claimed in claim 1, further comprising a wet cleaning step for removing a natural oxide layer existing in an exposed surface of the tungsten bit line, after step iii) and before step iv).

3. The method as claimed in claim 1, wherein the first tungsten layer is deposited with a thickness of about 300 to 500 Å.

4. The method as claimed in claim 1 or 3, wherein the first tungsten layer is deposited at a temperature of about 0 to 300° C.

5. The method as claimed in claim 1, wherein the second tungsten layer is deposited with a thickness of about 3000 to 5000 Å.

* * * * *